(12) United States Patent
Ueda et al.

(10) Patent No.: US 7,156,158 B2
(45) Date of Patent: Jan. 2, 2007

(54) HEAT PIPE TYPE COOLER

(75) Inventors: Akira Ueda, Kawasaki (JP); Masumi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/044,030

(22) Filed: Mar. 19, 1998

(65) Prior Publication Data

US 2001/0001981 A1    May 31, 2001

(30) Foreign Application Priority Data

Oct. 20, 1997    (JP) .................................. 9-287358

(51) Int. Cl.
  *F28D 15/00*    (2006.01)
(52) U.S. Cl. .................... 165/104.21; 165/104.33; 361/700; 361/709; 257/715
(58) Field of Classification Search .......... 165/104.14, 165/104.21, 104.26, 104.33, 185, 46; 257/715; 361/700, 707, 709; 174/16.3
See application file for complete search history.

(56) References Cited

U.S. PATENT DOCUMENTS

| | | | | | |
|---|---|---|---|---|---|
| 3,143,592 | A | * | 8/1964 | August .......................... 257/715 |
| 3,653,433 | A | * | 4/1972 | Scharli .................... 165/104.33 |
| 3,739,234 | A | * | 6/1973 | Bylund et al. ................ 257/715 |
| 4,226,282 | A | * | 10/1980 | Kunsagi et al. .......... 165/104.14 |
| 4,501,122 | A | * | 2/1985 | Cutler ................. 165/104.21 X |
| 4,588,023 | A | * | 5/1986 | Munekawa ............. 165/104.33 |
| 4,688,399 | A | * | 8/1987 | Reimann ................ 165/104.14 |
| 4,931,905 | A | * | 6/1990 | Cirrito et al. ................ 361/700 |
| 5,168,921 | A | * | 12/1992 | Meyer, IV ......... 165/104.33 X |
| 5,582,240 | A | * | 12/1996 | Widmayer ................... 165/185 |
| 5,699,853 | A | * | 12/1997 | Goth et al. ............. 165/104.33 |
| 5,729,995 | A | * | 3/1998 | Tajima .................... 165/104.33 |
| 5,764,482 | A | * | 6/1998 | Meyer, IV et al. .......... 361/700 |
| 5,819,407 | A | | 10/1998 | Terada |
| 5,842,514 | A | * | 12/1998 | Zapach et al. .......... 165/104.33 |

FOREIGN PATENT DOCUMENTS

| | | | | |
|---|---|---|---|---|
| DE | 3415554 | * | 10/1984 | ................. 165/185 |
| FR | 1190936 | * | 10/1959 | ............ 165/104.21 |
| GB | 0128898 | * | 2/1919 | ............ 165/104.21 |
| JP | 0160286 | * | 12/1980 | ............ 165/104.21 |
| JP | 356008860 | * | 1/1981 | ................. 257/715 |
| JP | 0065523 | * | 4/1982 | ............ 165/104.33 |
| JP | 0101293 | * | 6/1982 | ............ 165/104.33 |
| JP | 59-009550 | | 1/1984 | |

(Continued)

OTHER PUBLICATIONS

"*IBM Technical Disclosure Bulletin*," vol. 28, No. 1, Jun. 1995, pp. 110-112.*

*Primary Examiner*—Ljiljana Ciric
(74) *Attorney, Agent, or Firm*—Armstrong, Kratz, Quintos, Hanson & Brooks, LLP

(57) ABSTRACT

To realize a integrally constructed cooler of the heat pipe type which ensures the achievement of sufficient cooling capacity and the realization of a simple, compact and inexpensive cooler, that is especially low in height, employing and incorporating ingeniously a heat pipe, there is provided a heat pipe type cooler comprising: a heat receiving plate 3; a heat radiator having a configuration of a plurality of horizontally oriented heat radiation plates 5 extending vertically; and a heat pipe H having a generally U or V shaped profile, the middle portion of which is secured to the heat receiving plate 3: and wherein each end of the heat pipe H passes through the heat radiation plates 5.

3 Claims, 7 Drawing Sheets

FOREIGN PATENT DOCUMENTS

| | | | | |
|---|---|---|---|---|
| JP | 0095385 | * | 6/1984 | ............ 165/104.21 |
| JP | 0022193 | * | 1/1986 | ............ 165/104.14 |
| JP | 61-061895 | | 3/1986 | |
| JP | 0130789 | * | 6/1986 | ............ 165/104.14 |
| JP | 63-254754 | | 10/1988 | |
| JP | 63-245329 | | 4/1990 | |
| JP | 0126098 | * | 5/1990 | ................ 165/46 |
| JP | 03-096258 | | 4/1991 | |
| JP | 0396261 | * | 4/1991 | ............ 165/104.33 |
| JP | 3-134453 | | 6/1991 | |
| JP | 403232262 | * | 10/1991 | ................ 257/715 |
| JP | 404225790 | * | 8/1992 | ............ 165/104.21 |
| JP | 7-45759 | | 2/1995 | |
| JP | 07-169888 | | 7/1995 | |
| JP | 08-78587 | | 3/1996 | |
| JP | 08-290225 | | 11/1996 | |
| JP | 09-210581 | | 8/1997 | |

\* cited by examiner

HEAT PIPE TYPE COOLER

BACKGROUND OF THE INVENTION

1. Field of the Invention

The present invention relates to a heat pipe type cooler.

2. Description of the Related Art

At present, technologically advanced and miniaturized electronic equipments are appearing. This involves a serious problem of internally generated heat at a high temperature. Use of a heat pipe has been considered and examined for the purpose of efficiently transferring such heat.

A heat pipe is a heat-transfer device comprising a sealed metal tube of a generally straight bar shape, with an inner lining of a wicklike capillary material and containing a small amount of fluid (condensed fluid) in a partial vacuum. A heat is absorbed at one end by vaporization of the fluid and is released at the other end by condensation of the vapor. A heat pipe is characterized by its simple structure and its a high heat transfer rate per unit area, and it can be used in a wide range of temperatures in response to requirements.

Several examples of a cooling apparatus using heat pipes will be briefly described hereinbelow.

Japanese Unexamined Patent Publication (Kokai) No. 63-254754 discloses a cooling apparatus, having a straight bar shaped heat pipe, wherein one end of the heat pipe is embedded and fixed in a metal block, and the other end of the heat pipe has on its outer surface a plurality of disc shaped fins, spaced apart and in parallel to each other, and the heat pipe extends through the centers of the fins.

Japanese Unexamined Patent Publication (Kokai) No. 2-93270 discloses a cooling mechanism comprising cooling units, disposed in an air duct, wherein each of the cooling units has a straight bar shaped heat pipe of which one end is embedded and fixed in a heat generating element and the other end extends horizontally across the duct and has on its surface a plurality of square fins, spaced apart and in parallel to each other, such that the other end extends through and is perpendicular to the fins.

Japanese Unexamined Patent Publication (Kokai) No. 3-134453 discloses a cooling apparatus comprising a straight bar shaped heat pipe of which one end is embedded and fixed in a heater and the other end is inserted into the center of a bobbin-like radiating body.

Japanese Unexamined Patent Publication (Kokai) No. 3-96261 discloses a cooling apparatus comprising U shaped heat pipes wherein each of one end of each heat pipe is embedded and fixed in a corresponding side plate, and the other end of each heat pipe exists within a duct constructed by the side plates and extends through rectangular fins spaced apart and disposed in parallel to each other.

Japanese Unexamined Patent Publication (Kokai) No. 7-45759 discloses a cooling apparatus comprising a straight bar-shaped heat pipe, one end of which is embedded and fixed in a heat receiving plate, the other of which has on its surface a plurality of square fins spaced apart and disposed in parallel to each other such that the heat pipe extends through the fins.

However, according to the above prior art structures, there is a problem in that, since each of the heat receiving parts inevitably requires a considerable height due to the straight bar portion of the heat pipe perpendicularly embedded therein, there cannot be provided a cooler designed to the small in size and economical in operation.

SUMMARY OF THE INVENTION

The primary object of the present invention is, therefore, to provide a integrally constructed cooler of the heat pipe type, which is free from the aforementioned drawbacks and which ensures the achievement of sufficient cooling capacity and the realization of a simple, compact and inexpensive cooler, that is especially low in height, employing and incorporating ingeniously a heat pipe.

To achieve the above object, according to a first feature of the present invention, there is provided a heat pipe type cooler comprising: a heat receiver; a heat radiator; and a heat pipe; and wherein the heat pipe has a generally U or V shaped profile and is secured at its middle portion to the heat receiver and wherein the heat receiver and the heat radiator are thermally connected with the heat pipe.

Preferably, the heat radiator may have a configuration of a plurality of horizontally oriented heat radiation plates extending vertically and wherein each end of the heat pipe passes through the heat radiation plates. Preferably, the heat radiator may have corrugations. Preferably, the heat receiver may have a ridged portion for heat radiation. Preferably, the cooler may further comprise a fastener to secure the heat receiver to a subject to be cooled. Preferably, the cooler may further comprise a connector for another cooler. Further preferably, the connector may comprise a hook portion and a hook engaging portion.

According to another feature of the present invention, there is provided a heat pipe type cooler, comprising: a heat receiver; a heat radiator; and a plurality of heat pipes; and wherein each of the heat pipes has a generally U or V shaped profile and is secured at its middle portion to the heat receiver and wherein the heat receiver and the heat radiator are thermally connected with the heat pipes.

Preferably, the heat radiator may have a configuration of a plurality of horizontally oriented heat radiation plates extending vertically and wherein each end of each of the heat pipe passes through the heat radiation plates. Preferably, the heat pipes may be parallely spaced apart and disposed in a horizontal row. Preferably, the cooler may further comprise a ventilation duct with an inlet and an outlet such that it surrounds the heat radiator. Preferably, the cooler may further comprise a fan interposed between preselected heat pipes.

BRIEF DESCRIPTION OF THE DRAWINGS

These and other objects of the present invention will become apparent from the following detailed description of the preferred embodiments of the invention in connection with the accompanying drawings.

In the drawings.

DETAILED DESCRIPTION OF THE PREFERRED EMBODIMENTS

Figure 1:
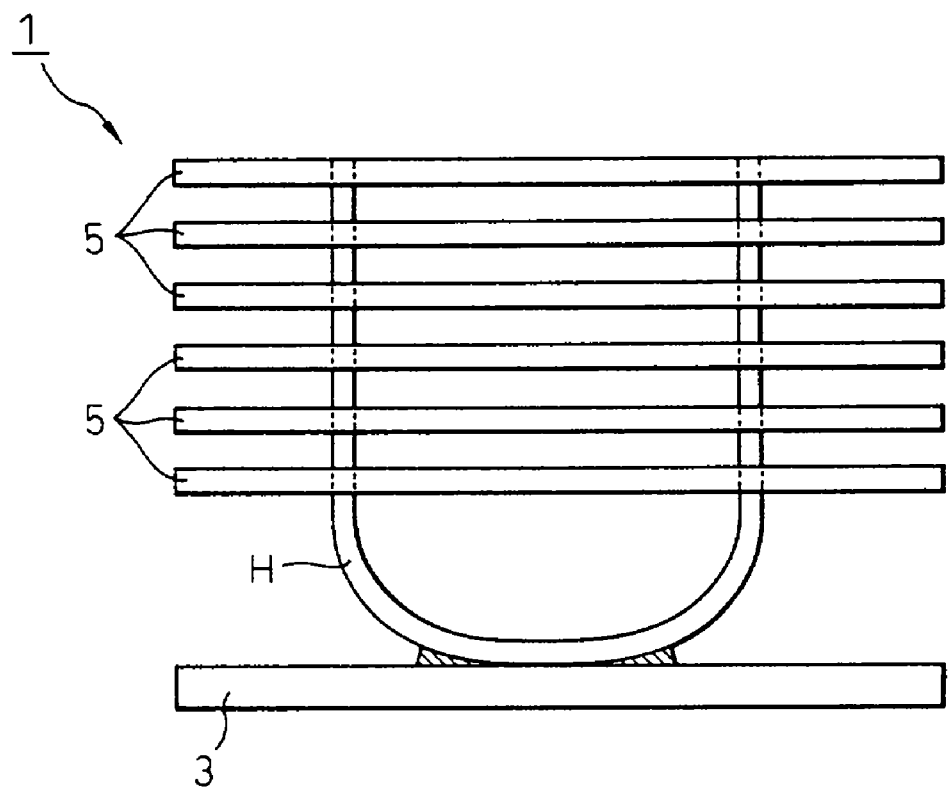
FIG. 1 is a frontal view showing a heat pipe type cooler of a first embodiment according to the invention.
Figure 2:
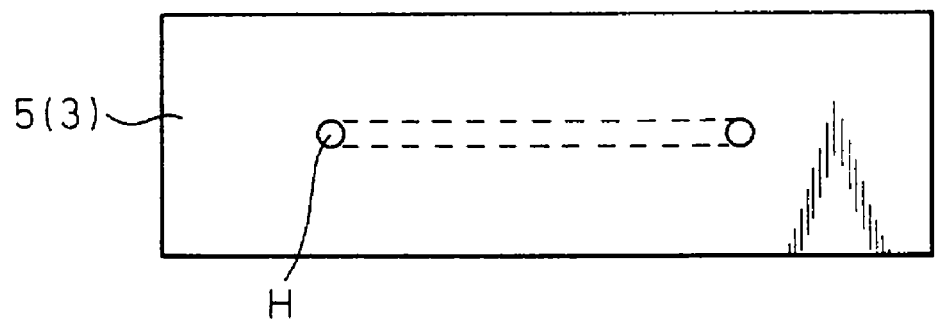
FIG. 2 is a top view showing the cooler of FIG. 1.
Figure 3:
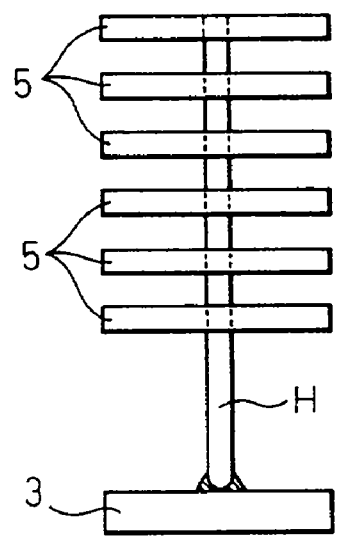
FIG. 3 is a side view showing the cooler of FIG. 1.

Preferred embodiments of the present invention are described hereunder, in detail, with reference to the drawings attached hereto. Common parts in each of the following embodiments are given the same reference characters/numbers, and thus a description thereof is properly omitted, and only parts characteristic of the present invention is mainly described hereunder.

FIGS. 1 to 4 show a first embodiment of heat pipe type cooler according to the invention.

Figure 5:
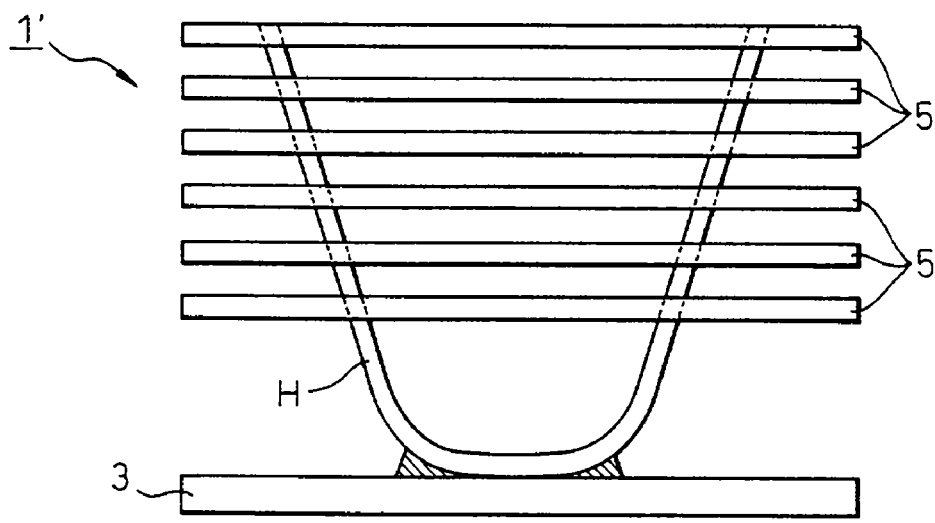
FIG. 5 is a view showing a cooler including a heat pipe modified.

With reference to these drawings, the cooler 1 includes a rectangular, heat receiving plate 3 adapted to be fixed to an element (including a heat generator), not shown, intended to be cooled, and also includes a generally U-shaped heat pipe H. Instead, as shown in FIG. 5, a heat pipe H (composing another cooler 1') may have a profile resembling a letter V, the intermediate portion of which being not sharp but round, so as to compose another type of cooler 1'.

As seen in FIG. 1, the intermediate, curved portion of the heat pipe H is fixed to the center on an upper surface of the heat receiving plate 3.

The heat pipe H has upstanding end portions in parallel with each other. Both of the heat pipe end portions pass through a heat radiator 5. The heat radiator 5 has a configuration of a number of (in this embodiment, six) horizontally oriented heat radiation plates (or fins) extending vertically. The heat radiation plates 5 resemble the heat receiving plate 3 in shape.

The heat receiving plate 3 and the heat radiation plates 5 are made of a thermal conductive material, for example, aluminum and are thermally interconnected with the heat pipe H.

The heat receiving plate 3 can be made thin. This and other embodiments are described on the assumption that the heat receiving plate 3 may have a thickness of 0.5 mm.

The fixation of the heat pipe H to the heat receiving plate 3 is carried out by means of adhesion, soldering, caulking, and etc.

Figure 4:
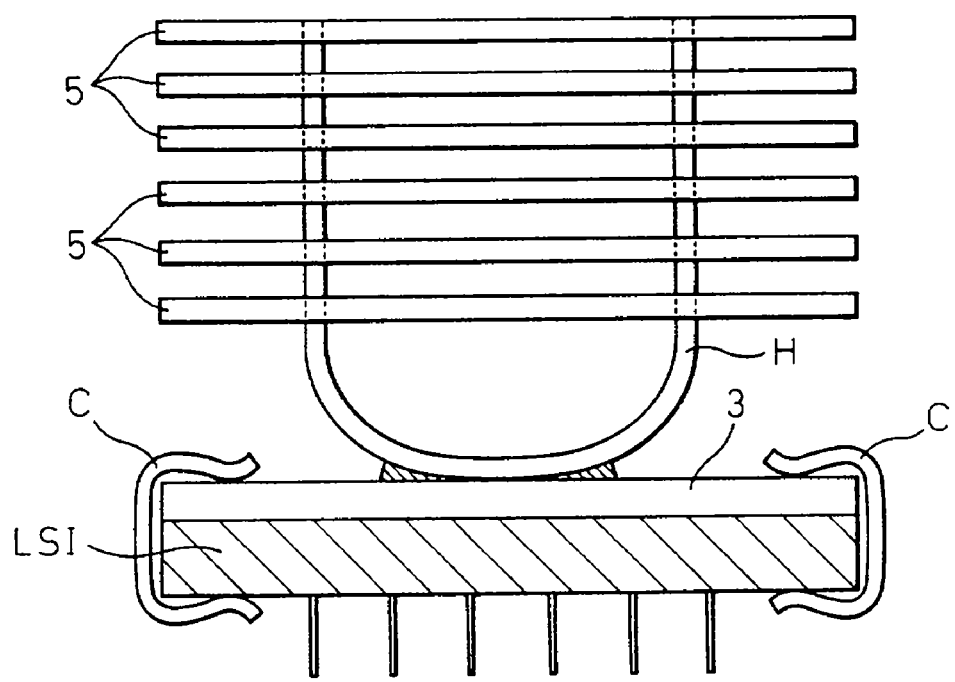
FIG. 4 is a side view showing the cooler fixed on the LSI.

In the first embodiment having the above-described structure, as can be seen in FIG. 4, the cooler 1 is placed and secured on a LSI (an example of heat generating elements) by means of a fastener, e.g., by means of a suitable number of C-shaped clips C made of elastic material, such as stainless steel. Instead of such clips as those separate from coolers, the heat radiation plates 5 or the heat receiving plate 3 may be provided with integrally formed portions (not shown), each of which can perform substantially the same function as that of the C-shaped clip C.

The heat generated by the LSI is conducted to the heat receiving plate 3 and is then transferred, through the heat pipe H, most efficiently to the heat radiation plates 5 where the heat is most effectively radiated outside.

A thermally conductive member (not shown), such as a flexible sheet made of silicon rubber, a layer of a thermal grease, etc., can be interposed to promote conductivity between the top surface of the LSI and the bottom surface of the heat receiving plate 3. In connection therewith, the thermally conductive member can relieve a stress which may be generated due to a difference of thermal expansion coefficient between the heat receiving plate 3 and the LSI, and further can absorb or counteract a shock, a jar, or a jolt.

Figure 6:
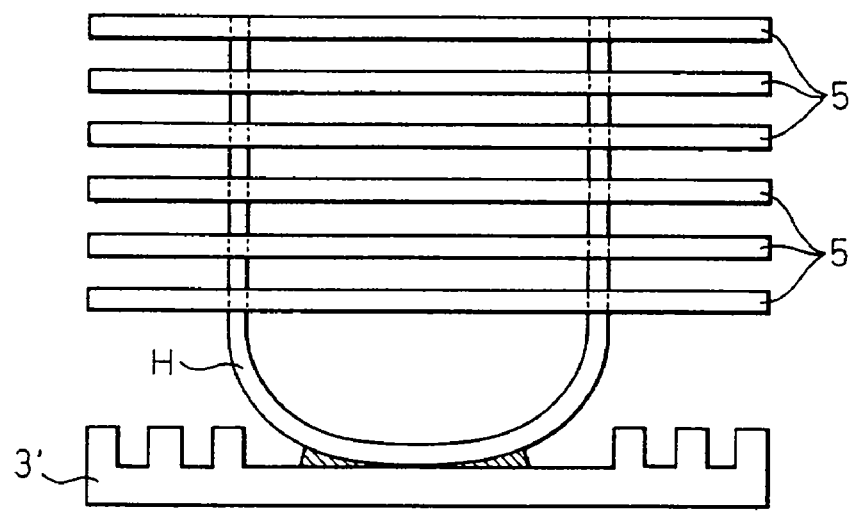
FIG. 6 is a view showing a cooler in which the heat receiving plate is provided with a rugged portion.

Incidentally, as can be seen in FIG. 6, the heat receiving plate 3' can be provided with a ridged portion (including protrusions and recesses) on its top surface so as to widen the surface area thereof to promote heat radiation from the heat receiving plate 3 per se.

Figure 7:
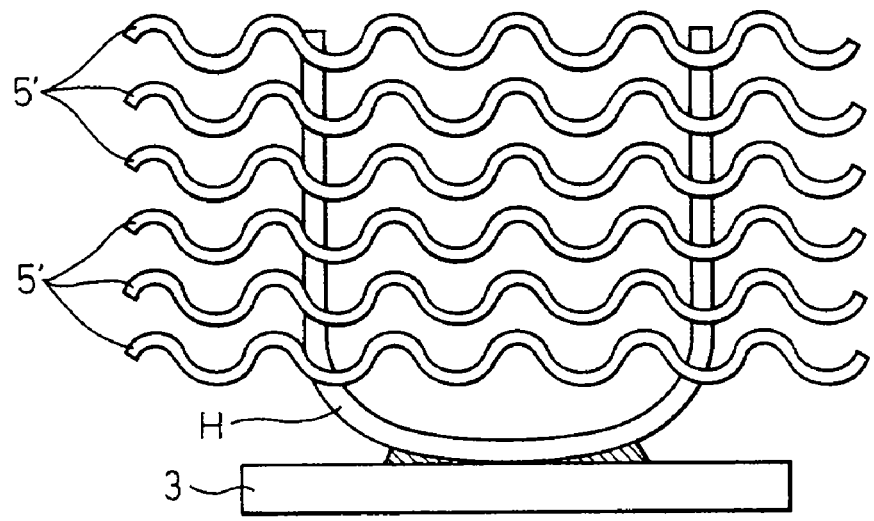
FIG. 7 is a view showing a cooler in which the heat radiation plates have corrugations.

As can be seen in FIG. 7, the heat radiation plates 5' can have corrugations for heat radiation promotion.

Figure 8:
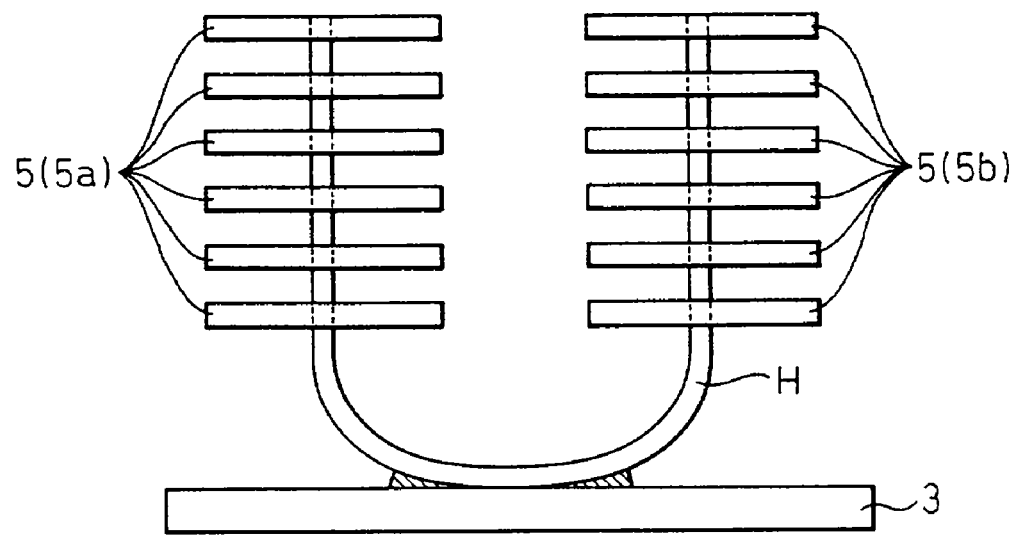
FIG. 8 is a view showing a cooler in which two heat radiators are spaced apart, separate from each other.

As can be seen in FIG. 8, there is provided another type of cooler which comprises a heat pipe H having a generally U shaped profile, the middle portion of which being fixed on a heat receiving plate 3, the end portions of which being upstanding, parallel each other, each being provided with a corresponding heat radiator 5 (5a, 5b) such that it passes therethrough.

Each of the heat radiators 5 has the same configuration wherein it comprises a group of horizontally oriented heat radiation plates 5a, 5b. The two groups of the heat radiation plates are spaced apart, separate from each other, and extend vertically. Further, another provision (not shown) can be made in which radiation plates (of at least one group) have the same tilting angle with respect to the corresponding, upstanding end portion of the heat pipe H.

To any of the above-described cases, various embodied coolers can use the concept that a large scale cooling system may be built by determining one type of cooler as a standard unit and by connecting a required number of the same type of coolers one after another in a row. One exemplary embodied example thereof is diagrammatically illustrated in FIG. 9.

Figure 9:
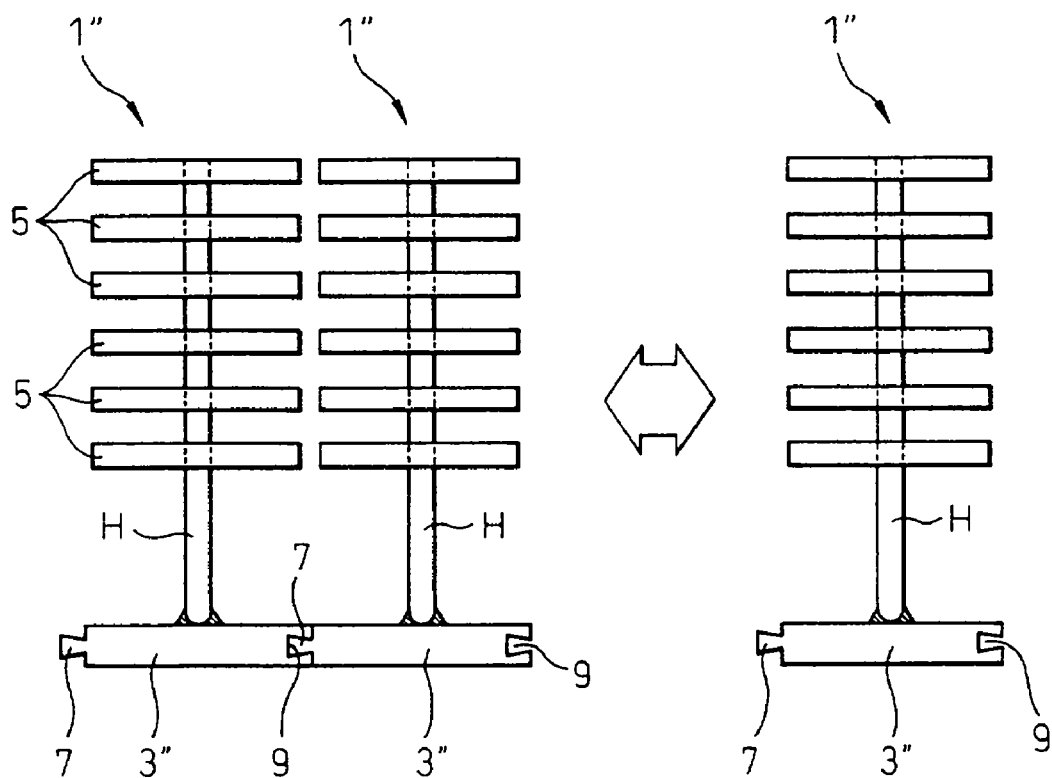
FIG. 9 is a view showing a cooling system comprising coolers interconnected.

Cooling units 1" of FIG. 9 each are similar to the cooler 1 according to the first embodiment. Each unit 1" has a heat receiving plate 3", at one end of which is provided a male type projection 7 (as an example of a hook portion according to the invention), at an opposite end of which is provided a female type depression 9 (as an example of a hook engaging portion according to the invention).

Unit connection is achieved by engaging a projection 7 of one unit with a depression 9 of the other unit. By connecting in a series a required number of units in the same way, a desired large scale cooling system for practical use can be easily and simply constructed.

Figure 10:
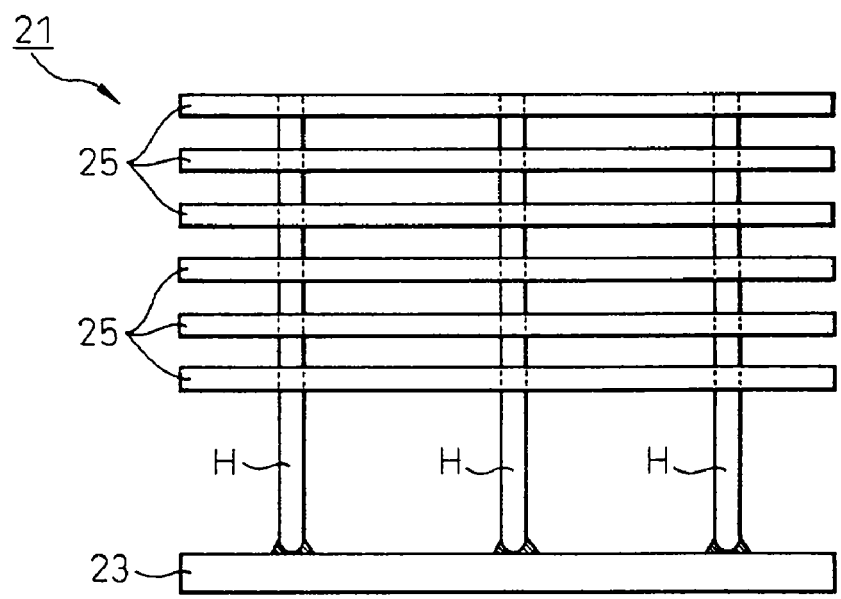
FIG. 10 is a view showing a cooler of another embodiment.
Figure 11:
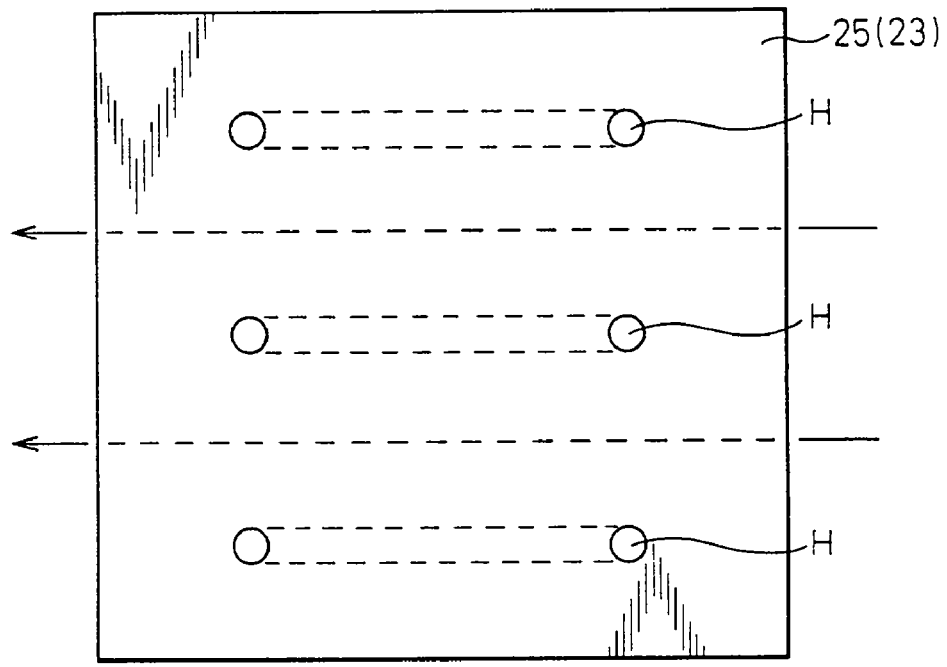
FIG. 11 is a top view showing the cooler of FIG. 10.

Referring now to FIGS. 10 and 11, another embodiment of the invention will be explained hereinafter. These drawings illustrate a cooler 21 comprising a heat receiving plate 23 and a plurality of heat pipes H (three heat pipes H in this embodiment). Each of the heat pipes H has a generally U-shaped profile, the middle, curved portion of which is fixed on the heat receiving plate 23.

As can be seen in the drawings, the heat pipes H are disposed substantially in parallel and extending generally in a horizontal row.

Each of the heat pipes H has upstanding end portions in parallel with each other which have a heat radiator 25 in a manner that they are passing therethrough.

The heat radiator 25 has substantially the same configuration as that of the above-described first embodiment, i.e., it comprises a number of (in this embodiment, there are six) heat radiation plates 25 disposed in a vertical row with a certain interval therebetween, the plates 25 horizontally extending in parallel with each other such that each end of each of the heat pipes H passes through the heat radiation plates 25.

Supposing that there is an air flow flowing from right hand side to left hand side in FIG. 11, the air may directly collide only with the upstanding heat pipe end portions which are disposed on the upstream side, i.e., right hand side. The air can hardly directly collide with the heat pipe end portions which are disposed on the downstream side, i.e., left hand side.

Figure 12:
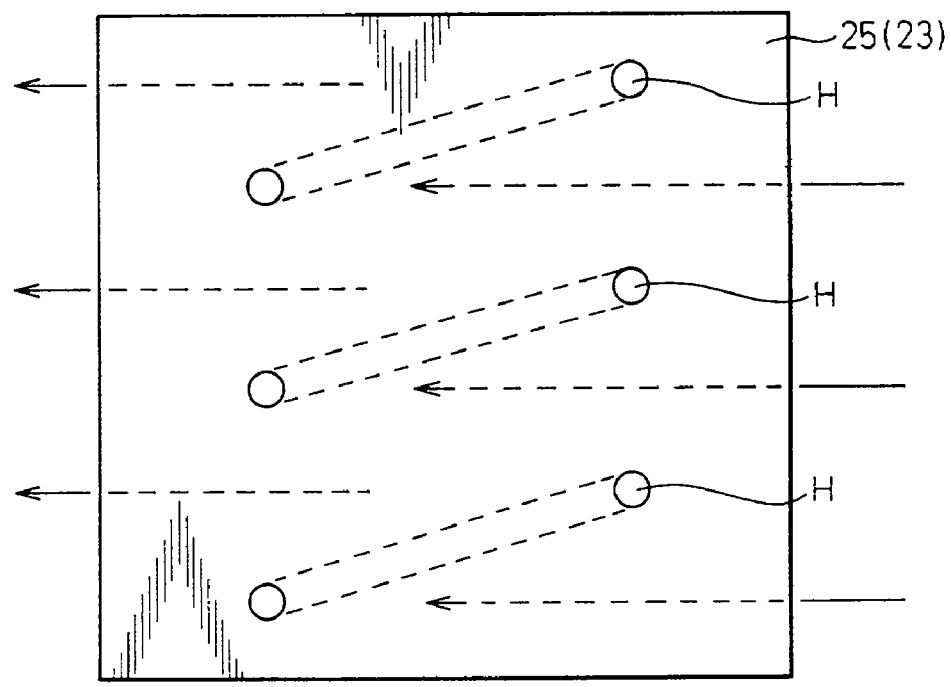
FIG. 12 is a top view showing a modification of the cooler of FIG. 10.

The heat pipes H can also be arranged such that the heat pipes each are located at a slant with respect to the bottom side of the heat receiving plate 23 (or of the heat radiation plates 25), when viewed from the upper side, as shown in FIG. 12. In this arrangement, the air can directly collide not only the upstream heat pipe end portions but also the downstream heat pipe end portions, thereby improving the heat radiation from the heat pipes.

Figure 13:
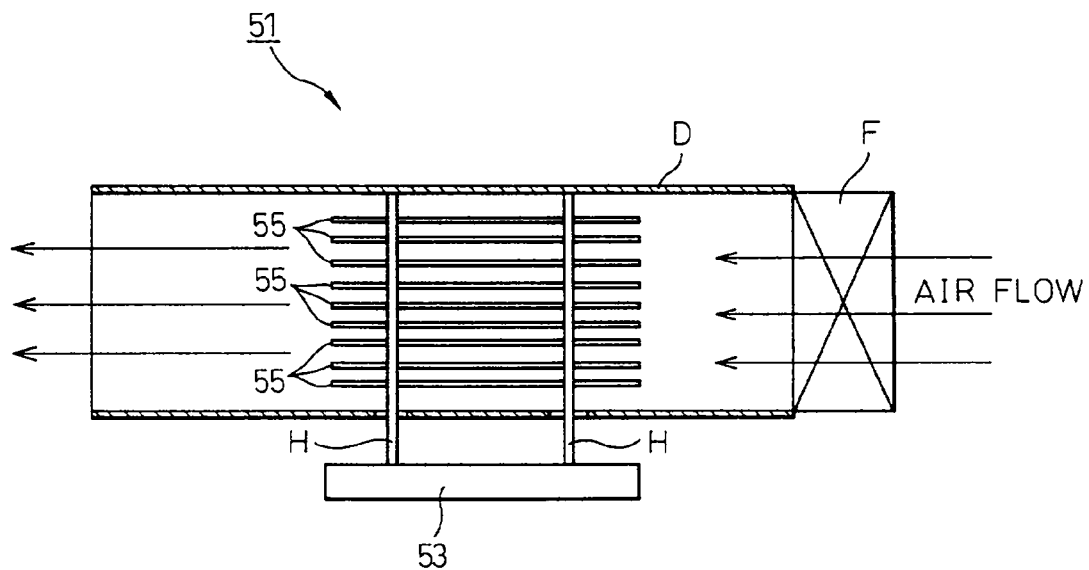
FIG. 13 is a cross-sectional view showing a cooler according to further embodiment.

Next, FIG. 13 shows a cooler according to a further embodiment of the invention. The cooler 51 comprises a heat receiving plate 53 and two generally U-shaped heat pipes H fixed on the heat receiving plate 53. The heat receiving plates provided with a heat radiator 55 at their upstanding end portions. The heat radiator 55 comprises a plurality of heat radiation plates 55 (in this embodiment, there are nine), extending horizontally in parallel with each other.

Figure 14:
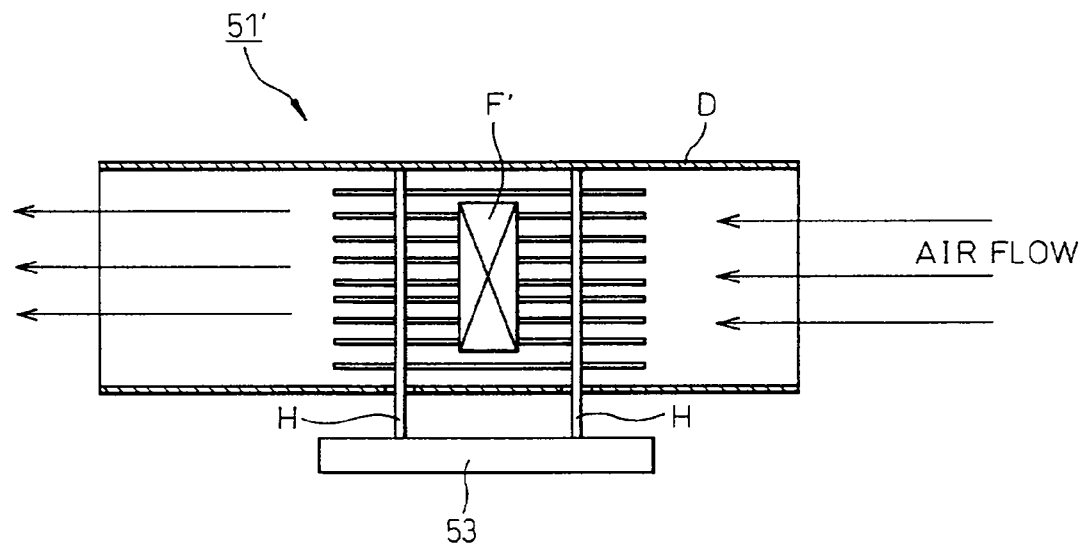
FIG. 14 is a cross-sectional view showing a modification of the cooler of FIG. 13.

The cooler 51 further comprises a ventilation duct D, for example, a square pipe, which surrounds at least the heat radiation plates and has an inlet opening (on the right side) and an outlet opening (on the left side). At the inlet is provided a fan F which may produce a current of air flowing through the duct. Further, as can be seen in FIG. 14, to make a small-sized cooler, another provision can be employed in which a fan F' is interposed between two neighboring heat pipes H.

It is to be understood that the present invention is by no means limited to the specific embodiments as illustrated and described herein, and that various modifications thereof may be made which come within the scope of the present invention as defined in the appended claims.

The invention claimed is:

1. A heat pipe cooler, comprising:
a heat receiving plate having lower and upper opposite surfaces, said lower surface of said heat receiving plate arranged to contact a semiconductor element which generates heat and is to be cooled, said upper surface of said heat receiving plate being flat;
a plurality of heat pipes fixed to flat portions of said flat upper surface of said heat receiving plate for thermal conduction, said plurality of heat pipes being upstanding with respect to said heat receiving plate, and said plurality of heat pipes being sealed at opposite end portions thereof;
a plurality of parallel heat radiating plates fixed to said plurality of heat pipes at positions along said plurality of heat pipes, said parallel heat radiating plates extending substantially parallel to, and having a shape corresponding to said heat receiving plate;
a distance between said heat receiving plate and one of said plurality of parallel heat radiating plates which is located adjacent to the heat receiving plate being substantially greater than a distance between two adjacent ones of said plurality of parallel heat radiating plates;
a ventilation duct surrounding said parallel heat radiating plates, said ventillation duct having an air inlet and an air outlet and defining a passage for air through a gap between said parallel heat radiating plates; and
a fan producing a current of air through said duct,
wherein each of said plurality of heat pipes a generally U-shaped or V-shaped profile,
wherein said heat receiving plate is arranged entirely outside said ventilation duct to permit cooling of said semiconductor element.

2. The heat pipe cooler according to claim 1, wherein each of said opposite end portions of said plurality of heat pipes passes through said plurality of parallel heat radiating plates.

3. The heat pipe cooler according to claim 1, wherein both said opposite end portions of each of said heat pipes are fixed to each of said plurality of parallel heat radiating plates.

* * * * *